(12) United States Patent
Bae et al.

(10) Patent No.: US 7,814,359 B2
(45) Date of Patent: Oct. 12, 2010

(54) HIGH-SPEED PHASE-ADJUSTED QUADRATURE DATA RATE (QDR) TRANSCEIVER AND METHOD THEREOF

(75) Inventors: Seung-Jun Bae, Daeseon-si (KR); Seong-Jin Jang, Seongnam-si (KR); Kwang-Il Park, Yongin-si (KR); Sang-Woong Shin, Seongnam-si (KR); Ho-Young Song, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 717 days.

(21) Appl. No.: 11/612,800

(22) Filed: Dec. 19, 2006

(65) Prior Publication Data

US 2007/0206428 A1     Sep. 6, 2007

(30) Foreign Application Priority Data

Dec. 19, 2005   (KR) ...................... 10-2005-0125551

(51) Int. Cl.
*G06F 12/00* (2006.01)
(52) U.S. Cl. ...................... 713/400; 713/401; 711/100; 711/154; 365/189.01; 365/190
(58) Field of Classification Search ......... 713/400–401; 365/189.01, 190; 711/100, 154
See application file for complete search history.

(56) References Cited

U.S. PATENT DOCUMENTS

| | | | |
|---|---|---|---|
| 6,323,698 B1 * | 11/2001 | Fletcher | 327/100 |
| 6,724,218 B2 * | 4/2004 | Porter et al. | 326/26 |
| 6,918,046 B2 | 7/2005 | Park et al. | |
| 7,269,699 B2 * | 9/2007 | Jang | 711/154 |
| 2003/0098717 A1 * | 5/2003 | Porter et al. | 326/112 |
| 2005/0005053 A1 | 1/2005 | Jang | |

FOREIGN PATENT DOCUMENTS

| | | |
|---|---|---|
| JP | 2005-032417 | 2/2005 |
| JP | 2005-078547 | 3/2005 |
| KR | 1020020002658 | 1/2002 |
| KR | 1020050003894 | 1/2005 |

* cited by examiner

*Primary Examiner*—Abdelmoniem Elamin
(74) *Attorney, Agent, or Firm*—F.Chau & Associates, LLC

(57) ABSTRACT

A high-speed double or quadrature data rate interface semiconductor device and a method thereof are provided. A transmitter (e.g., a data transmitting semiconductor device) for high-speed data transmission transmits a first strobe signal and a second strobe signal, which have a phase difference of 90 degrees there-between, a first group (byte of) data, and a second group (byte of) data. The transmitter adjusts the phase of at least one of the first and second strobe signals based on phase-error information fed back from a receiver and then transmits the phase-adjusted strobe signal to the receiver. The receiver receives the first and second strobe signals from the transmitter and receives the first group (byte of) data and the second group (byte of) data using the first and second strobe signals. The receiver does not require a phase-locked loop (PLL) or a delay-locked loop (DLL), thereby decreasing the circuit area and power consumption of the receiver. In addition, since source synchronization is realized using a strobe signal, phase noise can be efficiently removed.

25 Claims, 12 Drawing Sheets

(a)

(b)

HIGH-SPEED PHASE-ADJUSTED QUADRATURE DATA RATE (QDR) TRANSCEIVER AND METHOD THEREOF

This application claims the priority, under 35 U.S.C. §119, of Korean Patent Application No. 10-2005-0125551, filed on Dec. 19, 2005, in the Korean Intellectual Property Office, the disclosure of which is incorporated herein in its entirety by reference.

BACKGROUND OF THE INVENTION

1. Field of the Invention

The present invention relates to a high-speed data transceiver device, and more particularly, to a high-speed interface operating at a quadrature data rate (QDR) and a method thereof, optimally suited implementation in semiconductor memories.

2. Description of the Related Art

To increase a data transmission speed of semiconductor devices, a method of transmitting two or more bits (or symbols) of data per data pin (or bus) during a single clock cycle is widely used. An example is a double data rate (DDR) dynamic random access memory (DRAM). To achieve a higher data transmission rate than a DDR, recently, a quadrature data rate (QDR) method has been introduced.

FIGS. 1A and 1B are conceptual diagrams of a DDR transmission mode and a QDR transmission mode, respectively. Referring to FIG. 1A, a strobe signal DQS is used to transmit data in the DDR mode. In the DDR mode, a controller or a memory uses rising edges and falling edges of the strobe signal DQS when transmitting data DQ's. In addition, the rising edges and the falling edges of the strobe signal DQS are used to detect the data DQ's.

When the DDR mode is used, the data DQ's can be transmitted two times faster than the frequency of the strobe signal DQS. In other words, when the DDR mode is used, a data transmission speed two times higher than a frequency of a clock signal CLK can be achieved. Meanwhile, in semiconductor systems having a data transmission speed of several gigabytes per second or higher, the frequency of the strobe signal DQS should be several gigahertz. However, when the frequency of the strobe signal DQS is several gigahertz, it is difficult to distribute the strobe signal DQS on a chip and to operate a sampling circuit detecting the data DQ's. Accordingly, to overcome these problems, the QDR mode illustrated in FIG. 1B is used.

When the QDR mode is used, a data transmission speed four times higher than a frequency of a clock signal CLK can be achieved. In the QDR mode, rising edges and falling edges of two strobe signals DQS_0 and DQS_90 having a phase of 0 degrees and a phase of 90 degrees, respectively, are used to transmit data DQ's. Accordingly, a device for transmitting the data DQ's and a device for receiving the data DQ's need the two strobe signals DQS_0 and DQS_90.

FIG. 2 is a schematic block diagram of a conventional QDR transceiver semiconductor device including a QDR transmitter semiconductor device 200 and a QDR receiver semiconductor device 250. A QDR transmitter semiconductor device 200 (e.g., part of a memory controller) includes a data transmission circuit 210, a phase-locked loop (PLL) 220, and a strobe signal transmitter 230. The transmitter semiconductor device 200 generates two clock signals DQS_0 and DQS_90 having a phase difference of 90 degrees using the PLL 220. The data transmission circuit 210 transmits data DQ's using the two clock signals DQS_0 and DQS_90 generated by the PLL 220. The strobe signal transmitter 230 transmits one clock signal DQS among the two clock signals DQS_0 and DQS_90 generated by the PLL 220 to a receiver semiconductor device 250.

The receiver semiconductor device 250 (e.g., part of a memory device) includes a data reception circuit 260, a strobe buffer 270, and a delay-locked loop (DLL)/PLL 280. The strobe buffer 270 receives the strobe signal DQS from the transmitter semiconductor device 200 and buffers it. The DLL/PLL 280 generates an internal clock signal DQS_0' synchronized with the strobe signal DQS and an internal clock signal DQS_90' having a phase difference of 90 degrees with respect to the strobe signal DQS (or with DQS_0). The data reception circuit 260 receives the data DQ's using the two internal clock signals DQS_0' and DQS_90' output from the DLL/PLL 280.

As described above, in a conventional QDR mode, the receiver semiconductor device 250 requires the PLL or DLL 280 that can generate the clock signals DQS_0' and DQS_90' having a phase difference of 90 degrees. In this case, circuit area and power consumption is significant. Moreover, since the internal clock signals DQS_0' and DQS_90' are generated using the PLL or DLL 280, phase jitter may occur due to the characteristics of the PLL or DLL 280, as illustrated in (the signal DQS_90) in FIG. 1B. Furthermore, since a path difference occurs between the data DQ's and each of the clock signals DQS_0' and DQS_90', phase noise tracking is difficult.

SUMMARY OF THE INVENTION

Embodiments of the present invention provide high-speed double data rate or quadrature data rate interfaces and methods (e.g., phase-matched transmitting and receiving semiconductor devices) using a phase-adjusted quadrature strobe signal to efficiently remove phase noise and to reduce the circuit area and power consumption of a receiver.

According to an aspect of the present invention, there is provided a high-speed interface semiconductor device that comprises: a clock signal generation circuit, a first group (i.e., first byte) data transmission circuit, a second group (i.e., second byte) data transmission circuit, a first strobe signal transmission circuit, and a second strobe signal transmission circuit. The clock signal generation circuit generates a first clock signal and a second clock signal that have a phase difference of 90 degrees there-between. The first group data transmission circuit transmits first group data in response to the first and second clock signals. The first group data transmission circuit may also multiplex first group data prior to transmitting it. The second group data transmission circuit transmits second group data in response to the first and second clock signals. The first strobe signal transmission circuit transmits a first strobe signal based on the first clock signal. The second strobe signal transmission circuit transmits a second strobe signal based on the second clock signal. At least one of the first and second strobe signal transmission circuits adjusts the phase of a corresponding strobe signal based on phase-error information fed back from a receiver and then transmits the phase-adjusted strobe signal to the receiver.

According to another aspect of the present invention, there is provided a high-speed interface semiconductor device comprising: a strobe signal reception circuit, a first group data reception circuit, and a second group data reception circuit. The strobe signal reception circuit receives a first strobe signal and a second strobe signal, which have a phase difference of 90 degrees there-between, and generates a plurality of first group strobe signals and a plurality of second group strobe signals. The first group data reception circuit receives first group data based on the first group strobe signals. The second group data reception circuit receives second group data based on the second group strobe signals.

The strobe signal reception circuit may include a first strobe signal buffer receiving the first strobe signal and outputting a first reception strobe signal corresponding to one among the first group strobe signals, a second strobe signal buffer adjusting the phase of the first strobe signal and outputting a first additional strobe signal corresponding to one among the second group strobe signals, a third strobe signal buffer receiving the second strobe signal and outputting a second reception strobe signal corresponding to another one among the second group strobe signals, and a fourth strobe signal buffer adjusting the phase of the second strobe signal and outputting a second additional strobe signal corresponding to another one among the first group strobe signals. The first group data reception circuit receives the first group data in response to the first reception strobe signal and the second additional strobe signal. The second group data reception circuit receives the second group data in response to the second reception strobe signal and the first additional strobe signal.

According to still another aspect of the present invention, there is provided a high-speed interface method for a semiconductor device. The high-speed interface method includes generating a first clock signal and a second clock signal which have a phase difference of 90 degrees there-between, (multiplexing and) transmitting first group data in response to the first and second clock signals, (multiplexing and) transmitting second group data in response to the first and second clock signals, transmitting a first strobe signal based on the first clock signal, and transmitting a second strobe signal based on the second clock signal. Here, the phase of at least one of the first and second strobe signals is adjusted based on phase-error information fed back from a receiver and then the phase-adjusted strobe signal is transmitted to the receiver.

According to yet another aspect of the present invention, there is provided a high-speed interface method for a semiconductor device. The high-speed interface method includes receiving a first strobe signal and a second strobe signal, which have a phase difference of 90 degrees there-between, from a transmitter semiconductor device and generating a plurality of first group strobe signals and a plurality of second group strobe signals; and receiving first group data based on the first group strobe signals and second group data based on the second group strobe signals.

According to a further aspect of the present invention, there is provided a high-speed interface method for a semiconductor device. The high-speed interface method includes generating a first clock signal and a second clock signal by a transmitter semiconductor device; transmitting one data among first group data and a first strobe signal based on the first clock signal from the transmitter semiconductor device to a receiver; receiving the one data based on the first strobe signal and feeding first phase-error information back to the transmitter semiconductor device by the receiver; adjusting the phase of the first strobe signal based on the first data error information by the transmitter semiconductor device; transmitting one data among second group data and a second strobe signal based on the second clock signal from the transmitter semiconductor device to the receiver; receiving the one data based on the second strobe signal and feeding second data error information back to the transmitter semiconductor device by the receiver; and adjusting the phase of the second strobe signal based on the second data error information by the transmitter semiconductor device.

BRIEF DESCRIPTION OF THE DRAWINGS

The above and other features of the present invention will become more apparent to persons skilled in the art by describing in detail preferred embodiments thereof with reference to the attached drawings, in which like reference numerals denote like elements, and.

DETAILED DESCRIPTION OF THE EXEMPLARY EMBODIMENTS

Figure 3A:
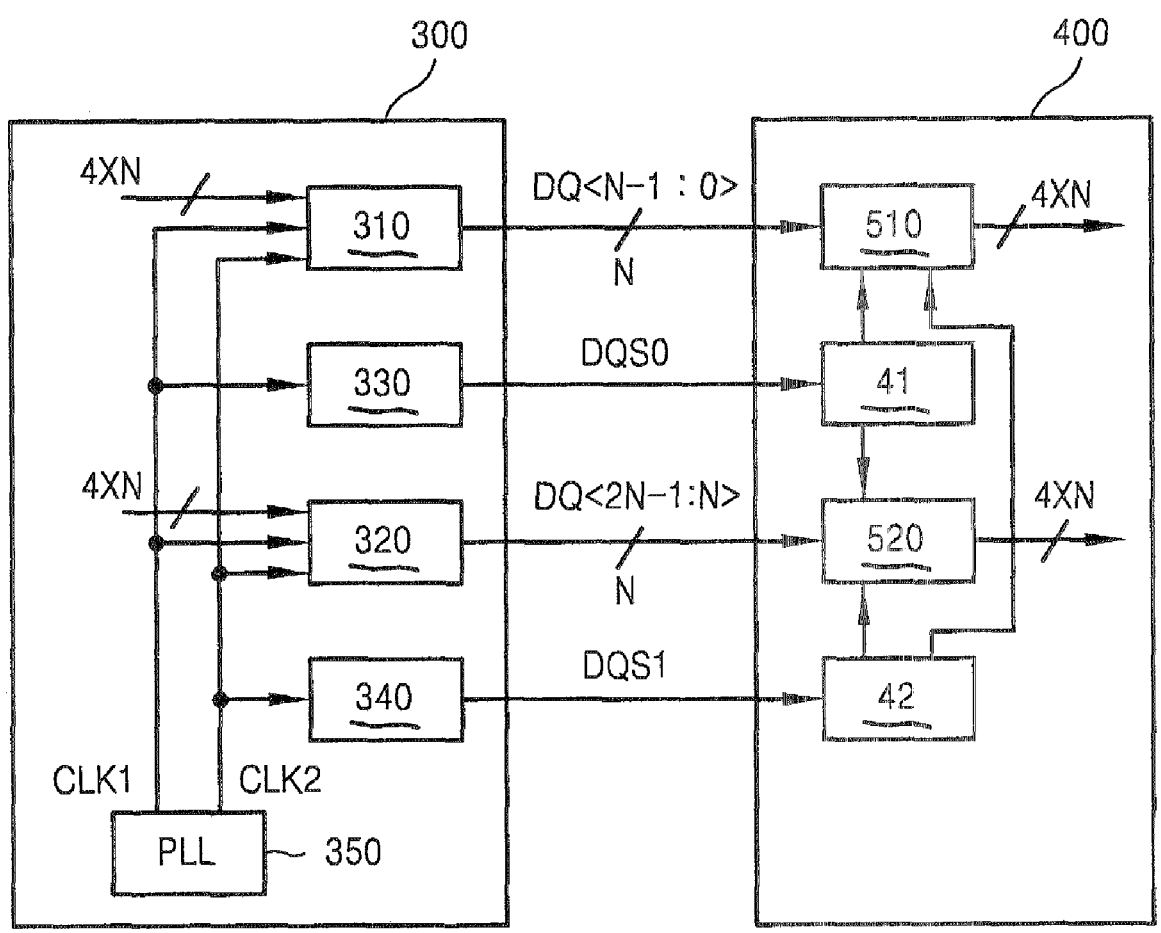
FIG. 3A is a schematic block diagram of a transmitter and a receiver in accordance with an embodiment of the present invention.
Figure 3B:
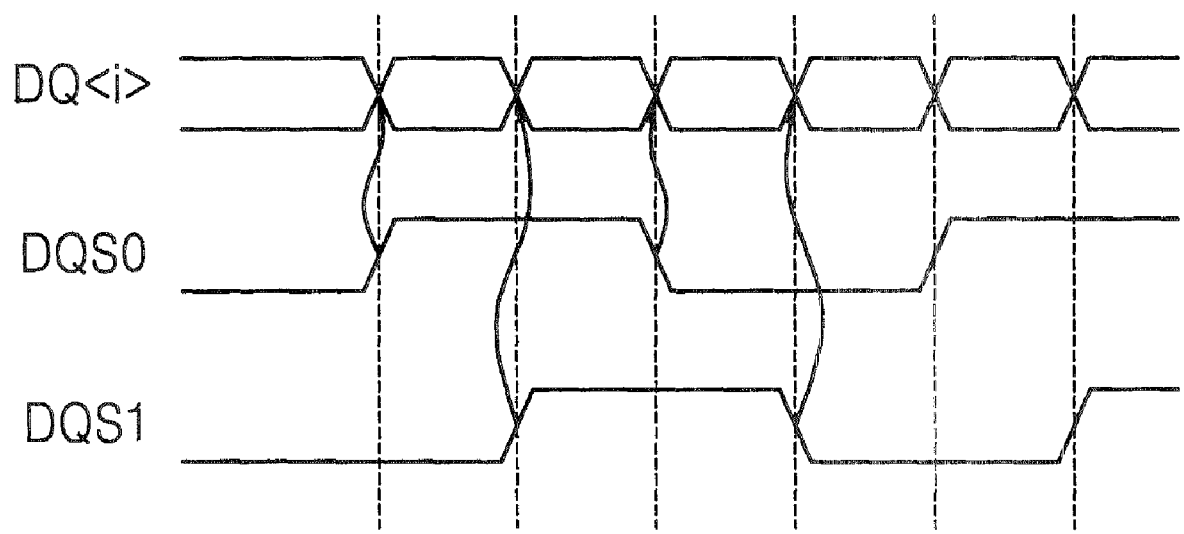
FIG. 3B illustrates an QDR interface method performed by the transmitter and a receiver of FIG. 3A.

FIG. 3A is a schematic block diagram illustrating the general structure of a transmitter (e.g., a data transmitting semiconductor device) 300 and of a receiver (e.g., a data receiving semiconductor device) 400 according to an embodiment of the present invention. FIG. 3B illustrates quadrature data rate (QDR) interface method performed by the transmitter 300 and receiver 400 of FIG. 3A. The devices and QDR interface method will be described with reference to FIGS. 3A and 3B.

The transmitter 300 generates two clock signals CLK1 and CLK2 having a phase difference of 90 degrees using a phase-locked loop (PLL) 350 and transmits first group (e.g., first byte) data DQ<N-1:0>, second group (e.g., second byte) data DQ<2N-1:N>, and two strobe signals DQS0 and DQS1 to the receiver 400. The strobe signals DQS0 and DQS1 may have the same phases as the clock signals CLK1 and CLK2, respectively, or may have corrected (e.g., shifted) phases with respect to the clock signals CLK1 and CLK2. Here, N is an integer number indicating the number of bits of data grouped in each of the first group data and in the second group data and may be 8 (i.e., one "byte") or 4 (i.e., one "nibble"). In other words, one strobe signal is transmitted per each group of 8 (or 4) bits of data DQ.

To perform the above-described operation, the transmitter 300 includes the PLL 350 generating the two clock signals CLK1 and CLK2 having a phase difference of 90 degrees, a first group data transmission circuit 310, a second group data transmission circuit 320, a first strobe signal transmission circuit 330, and a second strobe signal transmission circuit 340. A delay-locked loop (DLL) instead the PLL 330 may be used to generate the two clock signals CLK1 and CLK2. The first and second group data transmission circuits 310 and 320 convert N-bit data into first group data DQ<N-1:0> and into second group data DQ<2N-1:N>, which have a four times higher frequency (quadrature data rate), using the two clock signals CLK1 and CLK2 and respectively transmit the first group data DQ<N-1:0> and the second group data DQ<2N-1:N>. The first and second strobe signal transmission circuits 330 and 340 transmit quadrature strobe signals i.e., first and second strobe signals DQS0 and DQS1, respectively, which have a phase difference of 90 degrees, using the two clock signals CLK1 and CLK2, respectively.

The receiver 400 receives the first group data DQ<N-1:0> and the second group data DQ<2N-1:N> using the two strobe signals DQS0 and DQS1 transmitted from the transmitter 300. In the current embodiment of the present invention, the first strobe signal DQS0 having a phase of 0 degrees is transmitted for the first group data DQ<N-1:0> and the second strobe signal DQS1 having a phase of 90 degrees is transmitted for the second group data DQ<2N-1:N>.

The receiver 400 includes strobe signal reception circuits 41 and 42 and first and second group data reception circuits 510 and 520. The strobe signal reception circuits 41 and 42 respectively buffer the strobe signals DQS0 and DQS1 received from the transmitter 300 and respectively adjust (e.g., shift) the phases of the respective strobe signals DQS0 and DQS1. The first and second group data reception circuits 510 and 520 receive the first group data DQ<N-1:0> and the second group data DQ<2N-1:N>, respectively, each using a different pair of strobe signals respectively output from the strobe signal reception circuits 41 and 42.

Figure 1A:
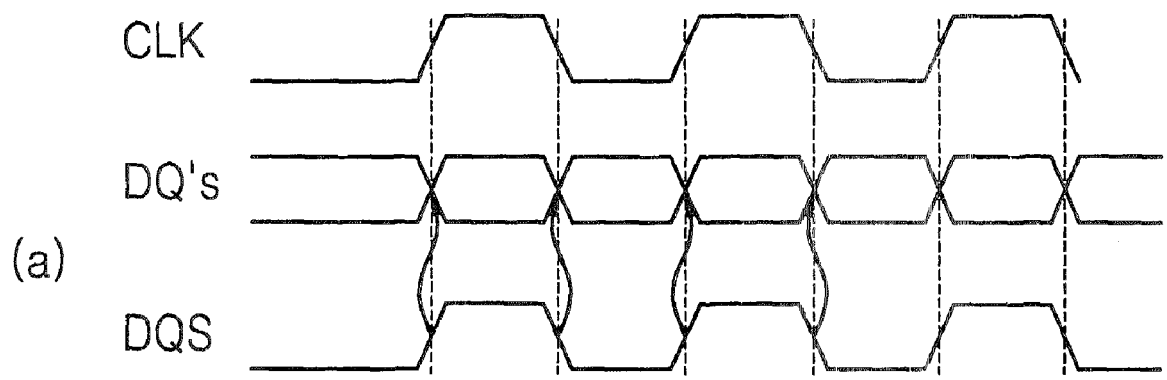
FIGS. 1A and 1B are conceptual diagrams illustrating data transmission in a double data rate (DDR) mode and in a quadrature data rate (QDR) mode, respectively.
Figure 1B:
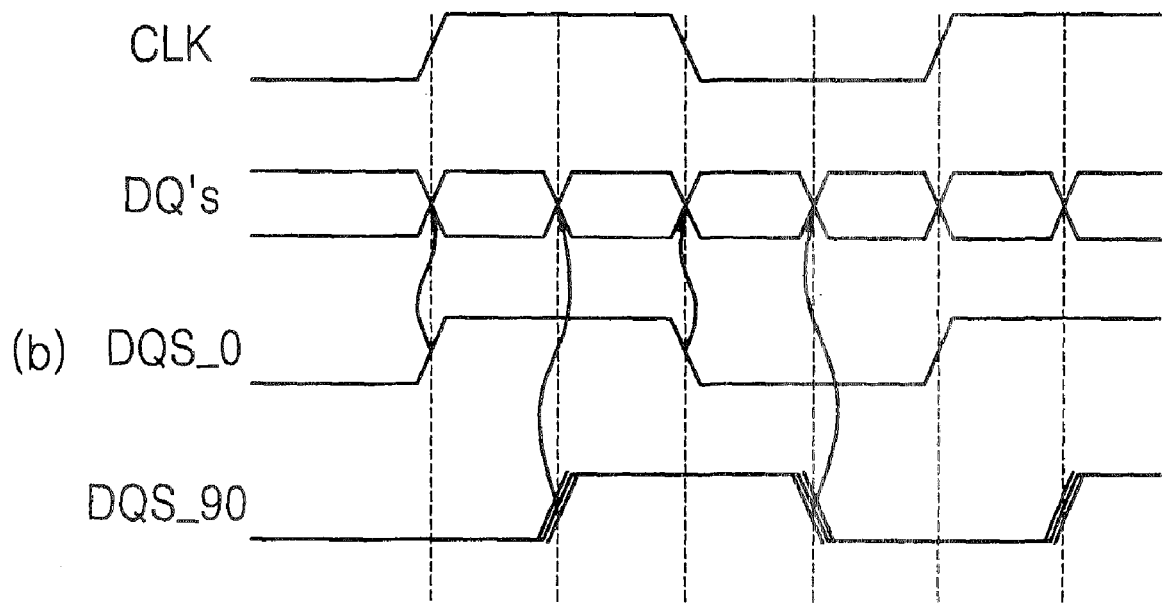
Figure 2:
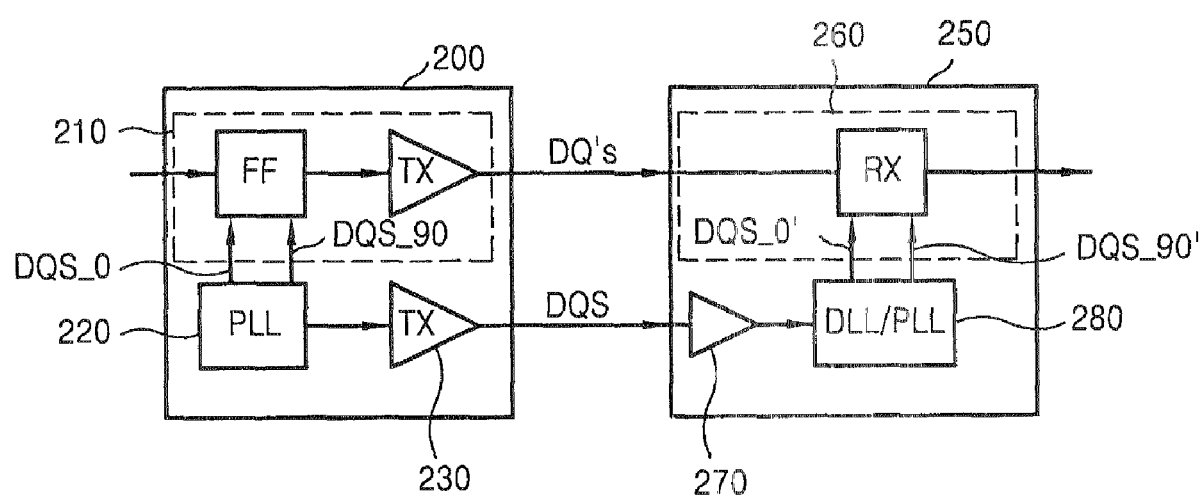
FIG. 2 is a schematic block diagram of a conventional QDR transceiver semiconductor device.

In the current embodiment of the present invention, strobe signals DQS in conventional double data rate (DDR) synchronous dynamic random access memory (SDRAM) (see FIG. 2) are replaced with the dual strobe signals DQS0 and DQS1 having a phase of 0 degrees and a phase of 90 degrees, respectively, for QDR interface performance. In this case, data DQ<i> (where, "i" is an integer of 0 through (2N-1)) is transmitted based on rising edges and falling edges of the strobe signals DQS0 and DQS1 and the receiver 400 detects the data DQ<i> using the strobe signals DQS0 and DQS1, so that data transmission four times faster than the frequency of the strobe signals DQS0 and DQS1 (quadrature data rate) can be accomplished. In addition, since the first and second strobe signals DQS0 and DQS1 are directly applied to the receiver 400, the receiver 400 does not need to internally generate a strobe signal having a phase difference of 90 degrees and thus does not need its own PLL or DLL.

Figure 4:
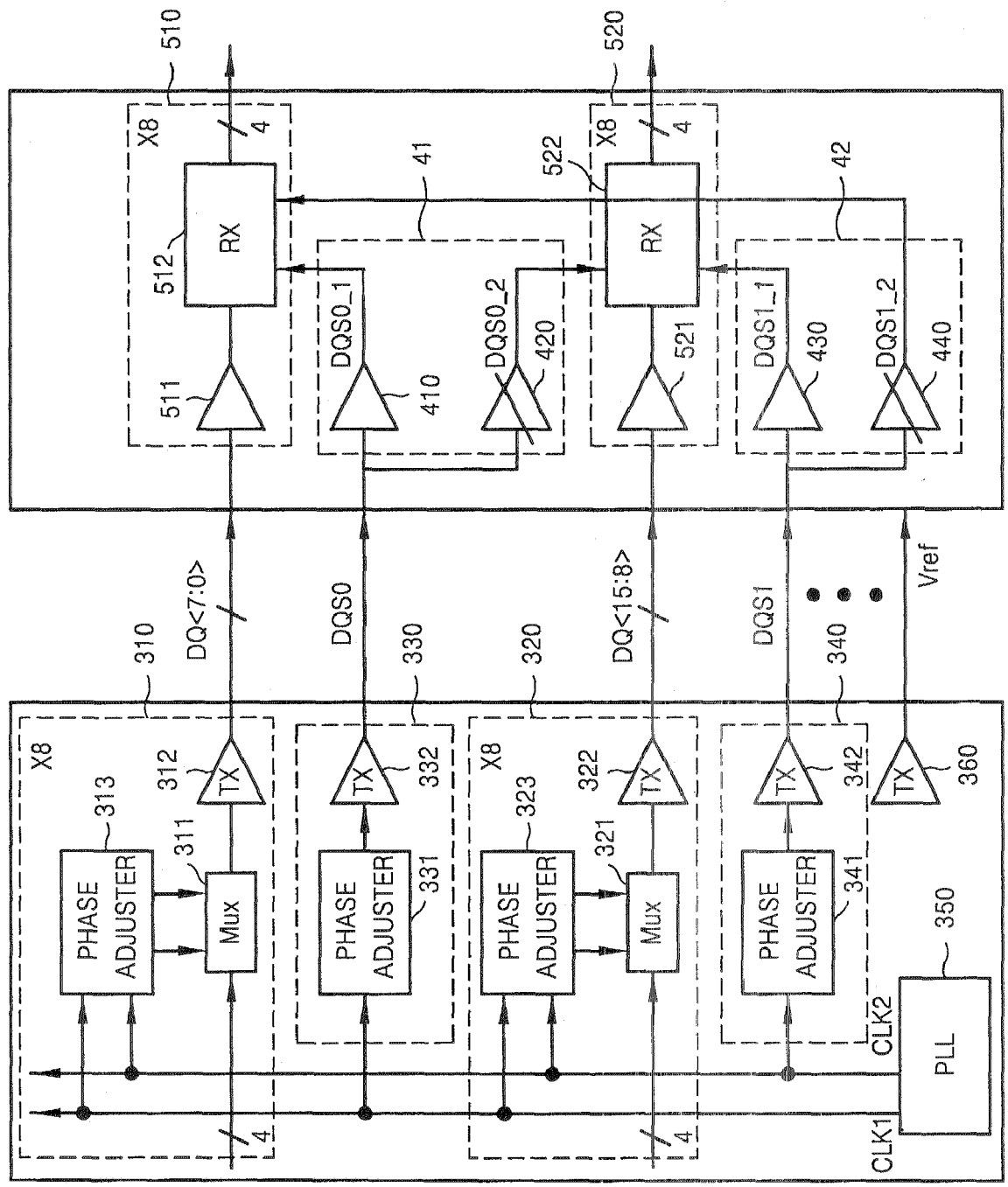
FIG. 4 is a detailed block diagram of the transmitter and the receiver illustrated in FIG. 3A.

FIG. 4 is a detailed block diagram of the transmitter 300 and the receiver 400 illustrated schematically in FIG. 3A. In the exemplary embodiment of the invention shown in FIG. 4, N equals 8.

As described above, the transmitter 300 includes the first and second group data transmission circuits 310 and 320, the first and second strobe signal transmission circuits 330 and 340, and the PLL 350. In addition, as shown in FIG. 4, the transmitter 300 may further include a reference voltage transmitter 360 for transmitting a reference voltage VREF to the receiver 400.

The first and second strobe signal transmission circuits 330 and 340 transmit the first and second strobe signals DQS0 and DQS1, respectively, based on the first and second clock signals CLK1 and CLK2, respectively. The first strobe signal transmission circuit 330 transmits the first strobe signal DQS0 based on the first clock signal CLK1 having a phase of 0 degrees and the second strobe signal transmission circuit 340 transmits the second strobe signal DQS1 based on the second clock signal CLK2 having the same frequency (as CLK1) and a phase of 90 degrees.

The first strobe signal transmission circuit 330 includes a first signal transmitter 332 and a first phase adjuster 331. The second strobe signal transmission circuit 340 includes a second signal transmitter 342 and a second phase adjuster 341. The first and second phase adjusters 331 and 341 respectively adjust the phases of the respective first and second strobe signals DQS0 and DQS1. This will be described in more detail with reference to FIGS. 5A through 5D below.

The first group data transmission circuit 310 multiplexes 4*8-bit data using the first and second clock signals CLK1 and CLK2 and transmits first group data DQ<7:0>. The second group data transmission circuit 320 multiplexes the 4*8-bit data using the first and second clock signals CLK1 and CLK2 and transmits second group data DQ<15:8>. For these operations, the first group data transmission circuit 310 includes eight multiplexers 311, eight data transmitters 312, and eight phase adjusters 313 and the second group data transmission circuit 320 includes eight multiplexers 321, eight data transmitters 322, and eight phase adjusters 323. In other words, as illustrated in FIG. 4, the first group data transmission circuit 310 includes 8 circuits (×8) each circuit including a multiplexer 311, a data transmitter 312, and a phase adjuster 313 and the second group data transmission circuit 320 includes 8 circuits (×8) each circuit including a multiplexer 321, a data transmitter 322, and a phase adjuster 323.

Each of the phase adjusters 313 and 323 adjusts the phases of the first and second clock signals CLK1 and CLK2 to adjust the phase of corresponding data DQ<i> which will be described in greater detail with reference to FIGS. 5A through 5D below.

Each of the multiplexers 311 and 321 multiplexes 4-bit parallel data into serial data in response to the first and second clock signals CLK1 and CLK2 which are phase-adjusted by each corresponding one of the phase adjusters 313 and 323. Each of the data transmitters 312 and 322 transmits the data DQ<i> (where "i" is an integer of 0 through N-1.) output from each corresponding one of the multiplexers 313 and 323 to the receiver 400.

The receiver 400 of FIG. 4 includes first through fourth strobe signal buffer circuits 410, 420, 430, and 440 and the first and second group data reception circuits 510 and 520. The first and third strobe signal buffer circuits 410 and 430 receive and buffer the first and second strobe signals DQS0 and DQS1, respectively, and output first and second reception strobe signals DQS0_1 and DQS1_1, respectively. The second and fourth strobe signal buffer circuits 420 and 440 respectively receive the first and second strobe signals DQS0 and DQS1, respectively adjust (shift) the phases of the respective first and second strobe signals DQS0 and DQS1, and respectively output first and second additional strobe signals DQS0_2 and DQS1_2.

The first group data reception circuit 510 demultiplexes the first group data DQ<7:0> in response to output signals of the first and fourth strobe signal buffer circuits 410 and 440, i.e., in response to the first reception strobe signal DQS0_1 and the second additional strobe signal DQS1_2. The second group data reception circuit 520 demultiplexes the second group data DQ<15:8> in response to output signals of the second and third strobe signal buffer circuits 420 and 430, i.e., the first additional strobe signal DQS0_2 and the second reception strobe signal DQS1_1.

In addition to the first and third strobe signal buffer circuits 410 and 430 receiving the first and second strobe signals DQS0 and DQS1, respectively, the second and fourth strobe signal buffer circuits 420 and 440 are used in order to maintain a phase difference of 90 degrees between the first and second strobe signals DQS0 and DQS1 by removing a phase error occurring due to a path difference therebetween. Thus the first through fourth strobe signal buffer circuits 410 through 440 drives only 8 pieces of data DQ<i> (where "i" is an integer of 0 through N-1.).

According to the QDR transmission mode in the current embodiment of the present invention, when a data transmission speed is 4 Gb/s (e.g., per line, i.e., per each data pin (not shown)), the frequency of the strobe signals DQS0 and DQS1 is 1 GHz. If a DDR mode is used, the frequency of a strobe signal DQS would be 2 GHz.

FIGS. 5A through 5D are signal timing charts illustrating a method of compensating a phase of a quadrature strobe signal, performed by the transmitter 300 and the receiver 400 of FIG. 4, according to an embodiment of the present invention.

Figure 5A:
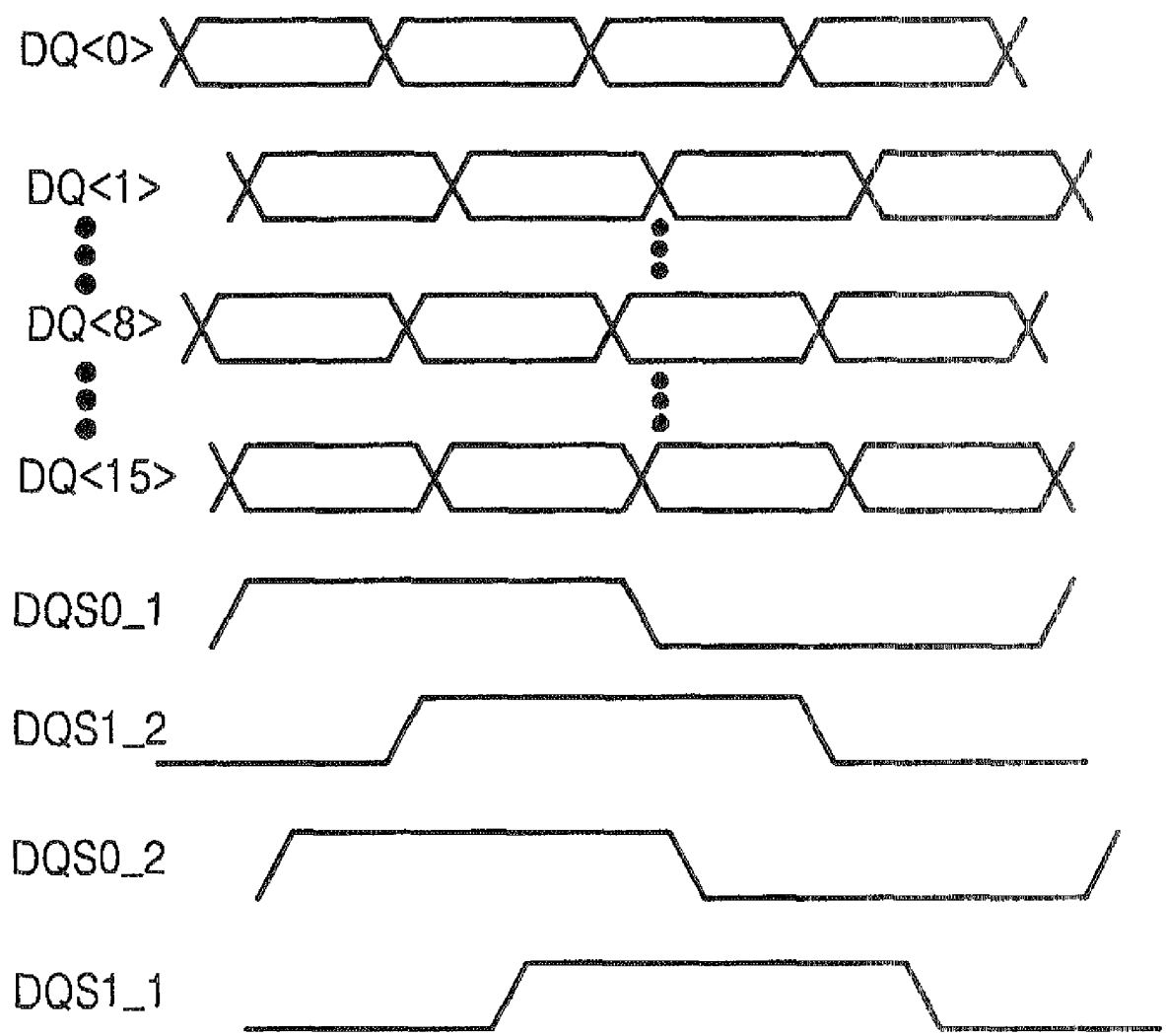
FIGS. 5A through 5D are signal timing charts illustrating a method of compensating a phase of a quadrature strobe signal, in accordance with an embodiment of the present invention.

FIG. 5A illustrates the phases of data DQ<i> and of strobe signals DQS0_1, DQS1_2, DQS0_2, and DQS1_1 that have not been (before being) phase-corrected. To synchronize the data DQ<i> with the strobe signals DQS0_1, DQS1_2, DQS0_2, and DQS1_1 in the receiver 400, phase correction is performed first on the first and second reception strobe signals DQS0_1 and DQS1_1.

The first reception strobe signal DQS0_1 is phase-corrected based on first data DQ<0>. For example, the transmitter 300 transmits the first data DQ<0> and the first strobe signal DQS0 using the first clock signal CLK1 in the DDR mode, so that the first reception strobe signal DQS0_1 is aligned to the first data DQ<0>. When the transmitter 300 transmits the first data DQ<0> using the first clock signal CLK1 in the DDR mode, the receiver 400 receives the first data DQ<0> using the first reception strobe signal DQS0_1, detects any data error occurring in the reception, and feeds the error-detection result back to the transmitter 300. Then, the transmitter 300 adjusts the phase of the first strobe signal DQS0 using the phase adjuster 331 of the first strobe signal transmission circuit 330 based on the error-detection feedback information. As a result, the phase of the first reception strobe signal DQS0_1 is adjusted (e.g., partially phase-corrected) based on first data DQ<0>. Thereafter, the first data DQ<0> is newly received using the phase-adjusted first reception strobe signal DQS0_1 and data error information is fed back again to the transmitter 300. Such processes may be repeated. With such repetition, the phase of the first data DQ<0> can be exactly synchronized with the phase of the first reception strobe signal DQS0_1.

The second reception strobe signal DQS1_1 is phase-corrected based on ninth data DQ<8>. The transmitter 300 transmits the ninth data DQ<8> and the second strobe signal DQS0_1 using the second clock signal CLK2 in the DDR mode, so that the second reception strobe signal DQS1_1 is aligned to the ninth data DQ<8>. The phase correction of the second reception strobe signal DQS1_1 is performed in the same (iterative) manner as that of the first reception strobe signal DQS0_1 and thus a detailed description thereof will be omitted. The phase correction of the first and second reception strobe signals DQS0_1 and DQS1_1 is performed by adjusting the phases of the first and second strobe signals DQS0 and DQS1 using the phase adjusters 331 and 341 of the respective first and second strobe signal transmission circuits 330 and 340 included in the transmitter 300.

Figure 5B:
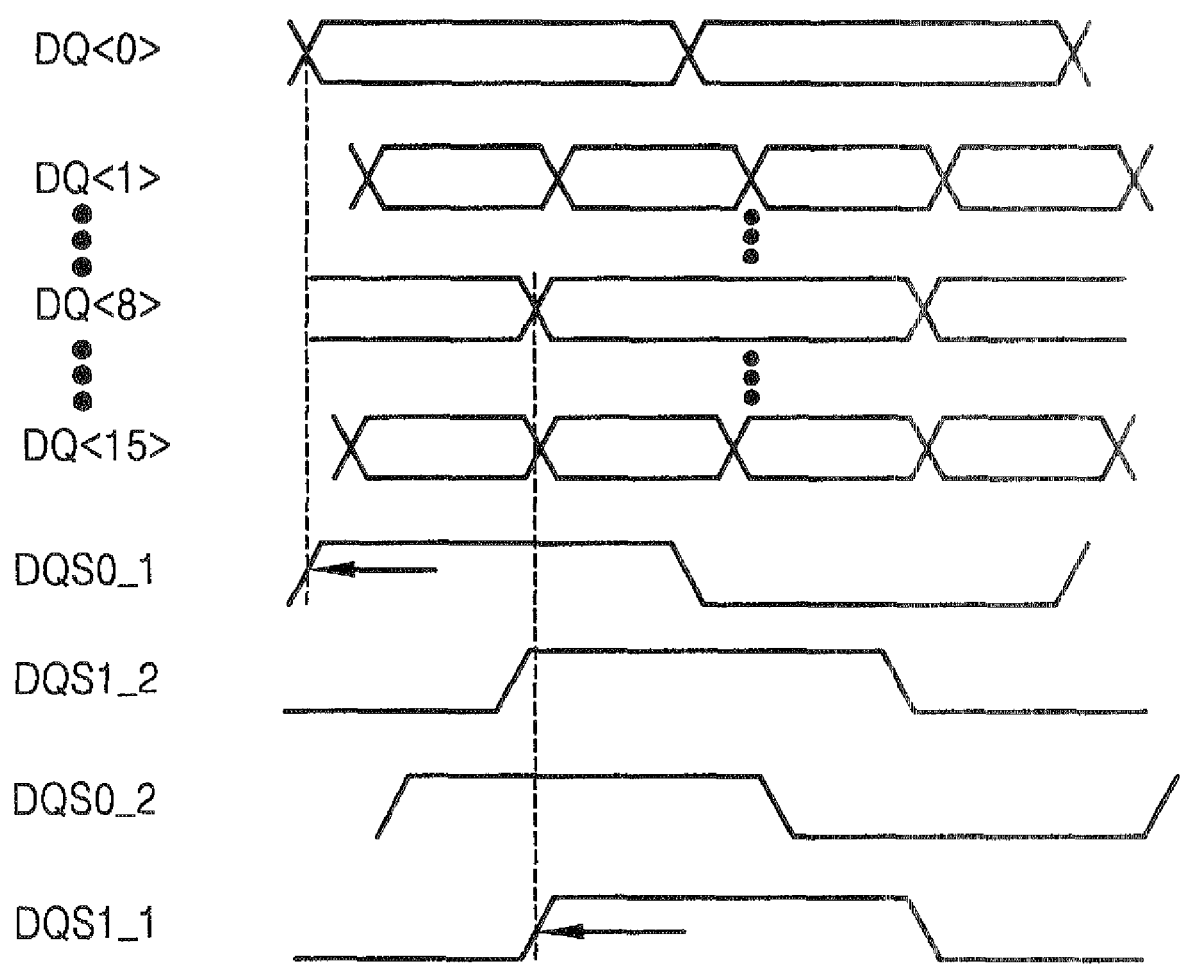

FIG. 5B illustrates the phases of the phase-corrected first and second reception strobe signals DQS0_1 and DQS1_1 and the phases of the data DQ<i>.

After the phases of the first and second reception strobe signals DQS0_1 and DQS1_1 are corrected, the phases of the first and second additional strobe signals DQS0_2 and DQS1_2 are corrected. For this phase correction, the transmitter 300 transmits the first data DQ<0> and the second strobe signal DQS1 using the second clock signal CLK2 and transmits ninth data DQ<8> and the first strobe signal DQS0 using the first clock signal CLK1 in the DDR mode, so that the first additional strobe signal DQS0_2 is aligned to the ninth data DQ<8> and the second additional strobe signal DQS1_2 is aligned to the first data DQ<0>. The phase correction of the first and second additional strobe signals DQS0_2 and DQS1_2 is performed in the same manner as that of the first and second reception strobe signals DQS0_1 and DQS1_1, with the exception that the phase correction of the first and second additional strobe signals DQS0_2 and DQS1_2 is performed by the second and fourth strobe signal buffer circuits 420 and 440 included in the receiver 400.

Figure 5C:
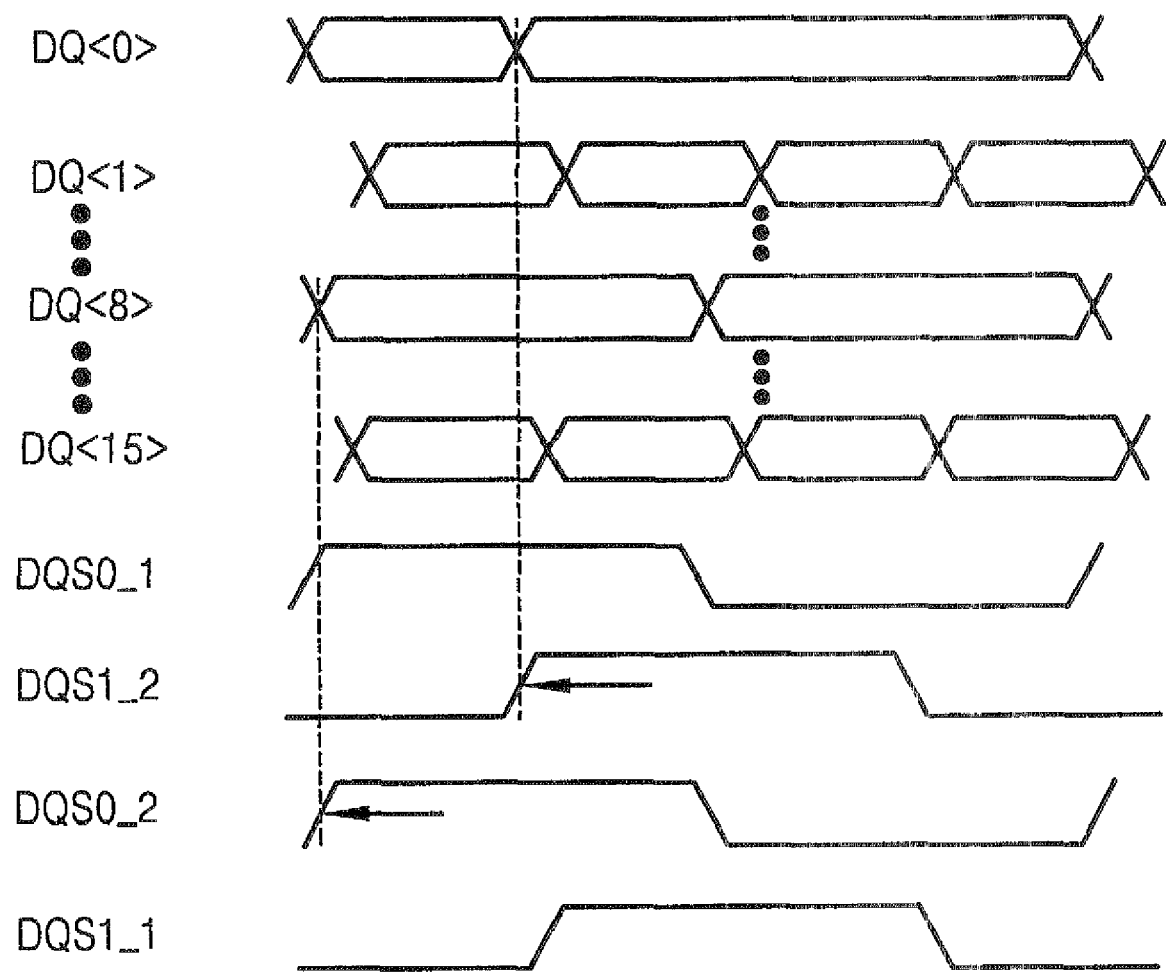

FIG. 5C illustrates the phases of the phase-corrected first and second reception strobe signals DQS0_1 an DQS1_1 and the phase-corrected first and second additional strobe signals DQS0_2 and DQS1_2 and the phases of the data DQ<i>. Through the phase correction of the four strobe signals DQS0_1, DQS1_2, DQS0_2, and DQS1_1 skew between the four strobe signals DQS0_1, DQS1_2, DQS0_2, and DQS1_1 is removed.

After all of the four strobe signals DQS0_1, DQS1_2, DQS0_2, and DQS1_1 are phase-corrected, the transmitter 300 performs phase correction with respect to each data DQ<i>, i.e., each data pin (not shown) in order to remove skew between each of the data DQ<i> (where, "i" is an integer of 0 through (2N-1)) and the strobe signals DQS0_1, DQS1_2, DQS0_2, and DQS1_1. As indicated in the circuit of FIG. 4, each group (i.e., byte) of data DQ<i> is aligned to one corresponding pair of strobe signals selected among a first pair of the strobe signals DQS0_1 & DQS1_2 and a second pair of the strobe signals DQS0_2 & DQS1_1.

In detail, each phase of the first group data DQ<7:0> is aligned to the first reception strobe signal DQS0_1 and the second additional strobe signal DQS1_2 and each phase of the second group data DQ<15:8> is aligned to the first additional strobe signal DQS0_2 and the second reception strobe signal DQS1_1. The phase correction of the data DQ<i> is performed by the phase adjusters 313 and 323 of the respective first and second group data transmission circuits 310 and 320 included in the transmitter 300.

Figure 5D:
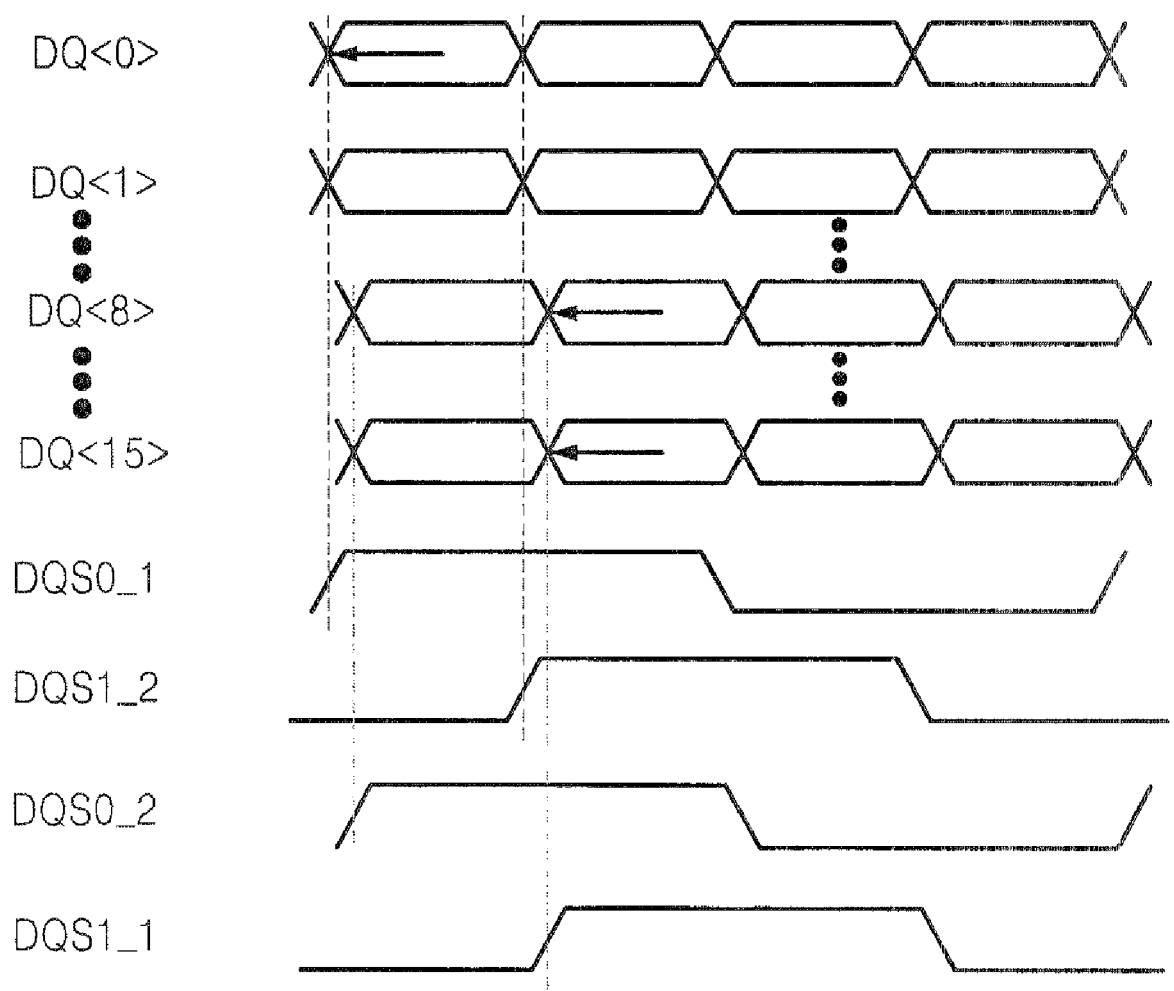

FIG. 5D illustrates the phases of the first and second reception strobe signals DQS0_1 and DQS1_1, the phases of the first and second additional strobe signals DQS0_2 and DQS1_2, and the phases of the data DQ<i>, after the phase correction of the data DQ<i> is completed. Referring to FIG. 5D, when the phase correction of the strobe signals DQS0_1, DQS1_2, DQS0_2, and DQS1_1 and the data DQ<i> is completed, the phase of each data DQ<i> is exactly synchronized with a corresponding pair of strobe signals selected among a pair of the strobe signals DQS0_1 & DQS1_2 and a pair of the strobe signals DQS0_2 & DQS1_1 in the receiver 400.

The phase correction of the strobe signals DQS0_1, DQS1_2, DQS0_2, and DQS1_1 and the data DQ<i> may be performed in a system initialization mode. After skew is removed by performing the phase correction of the strobe signals DQS0_1, DQS1_2, DQS0_2, and DQS1_1 and the data DQ<i>, data transmission may be reliably performed.

Figure 6:
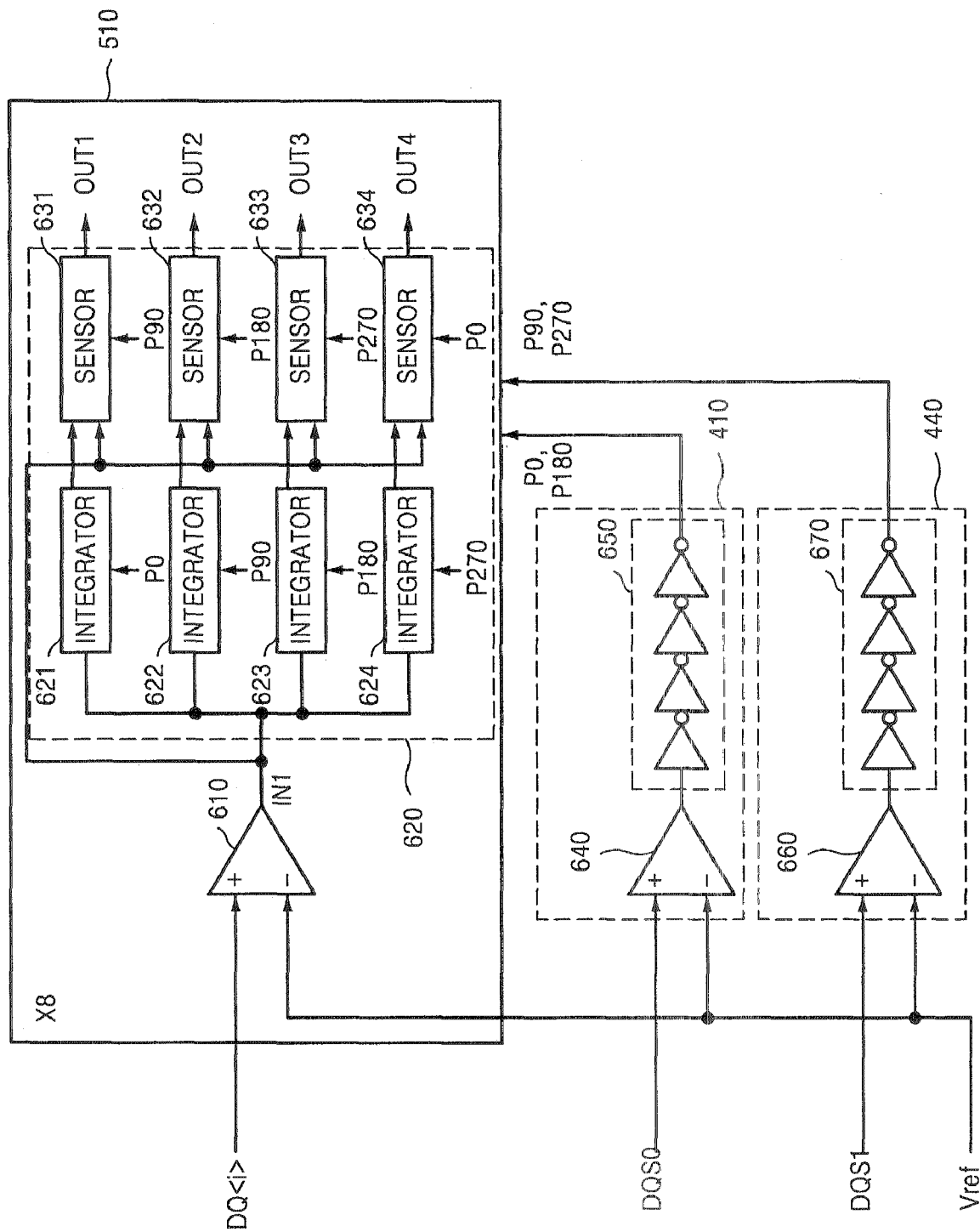
FIG. 6 is a detailed diagram of a first group (i.e., first byte) data reception circuit 510 and first and fourth strobe signal buffer circuits 410 and 440 shown in FIG. 4.

FIG. 6 is a detailed diagram of the first group data reception circuit 510 and first and fourth strobe signal buffer circuits 410 and 440 shown in FIG. 4. Referring to FIG. 6, the first group data reception circuit 510 includes a data buffer 610 and a data receiver 620 for each data DQ<i>. Accordingly, the first group data reception circuit 510 includes 8 circuits (×8) each including the data buffer 610 and the data receiver 620.

The data buffer 610 receives the data DQ<i> and the reference voltage VREF and outputs a signal based on a difference between a data voltage and the reference voltage VREF. The data receiver 620 includes first through fourth integrator 621 through 624 and first through fourth sensors 631 through 634 (i.e., sensors 63j; j=1, 2, 3, 4).

The first strobe signal buffer circuit 410 includes a buffer 640 and a driver 650. The fourth strobe signal buffer circuit 440 includes a buffer 660 and a driver 670.

Figure 7:
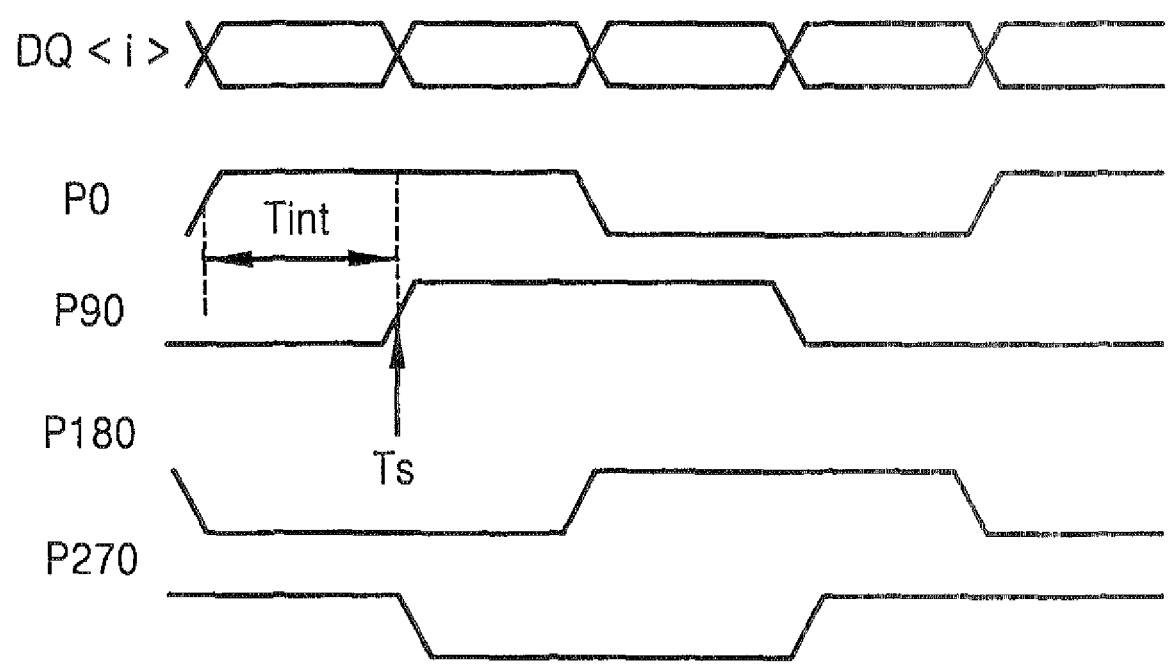
FIG. 7 is a signal timing chart illustrating the operation of the data receiver 620 in the data reception circuit 510 shown in FIG. 6.
Figure 8:
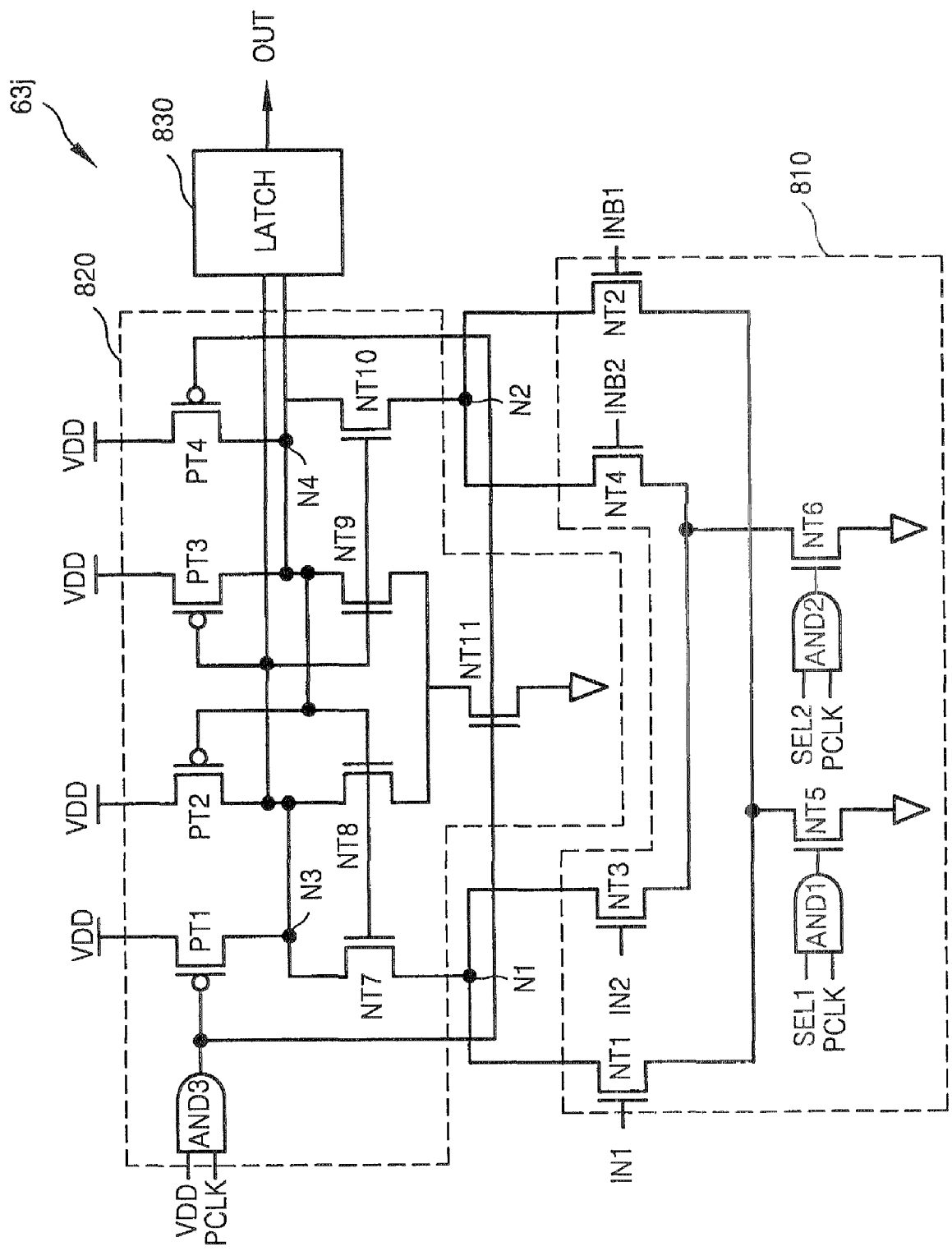
FIG. 8 is a circuit diagram of a sensor 63$j$ (j=1, 2, 3, 4) in the data receiver 620 shown in FIG. 6.

FIG. 7 is a signal timing chart illustrating the operation of the data receiver 620 in the data reception circuit 510 shown in FIG. 6. FIG. 8 is a circuit diagram of a sensor 63j (j=1, 2, 3, 4) in the data receiver 620 shown in FIG. 6. The operations of the first through fourth integrators 621 through 624 and the first through fourth sensors 631 through 634 will be described with reference to FIGS. 6 through 8 below.

The first integrator 621 integrates input data IN1 in response to a 0-degree clock signal P0. In other words, as illustrated in FIG. 7, the first integrator 621 integrates the input data IN1 within a time segment Tint beginning at a rising edge of the 0-degree clock signal P0 and ending at a rising edge of a 90-degree clock signal P90. The first sensor 631 selectively receives one of an integrated signal IN2 (output from the first integrator 621) and the input data IN1 (output from the data buffer 610), selected in response to predetermined selection signals SEL1 and SEL2 (FIG. 8) and the 90-degree clock signal P90, senses and amplifies the selected signal, and latches the amplified selected signal. In other words, the first sensor 631 senses, amplifies, and latches a signal selected at a rising edge Ts of the 90-degree clock signal P90.

The second integrator 622 integrates the input data IN1 in response to the 90-degree clock signal P90. The second sensor 632 selectively receives one of an integrated signal IN2 (output from the second integrator 622) and the input data signal IN1 (output by the data buffer 610) in response to the predetermined selection signals SEL1 and SEL2 (FIG. 8) and a 180-degree clock signal P180 and senses, amplifies and latches a selected signal.

The third integrator 623 integrates the input data IN1 in response to the 180-degree clock signal P180. The third sensor 633 selectively receives one of an integrated signal IN2 (output by the third integrator 623) and the input data signal IN1 (output by the data buffer 610) in response to the predetermined selection signals SEL1 and SEL2 (FIG. 8) and a 270-degree clock signal P270 and senses, amplifies and latches a selected signal.

The fourth integrator 624 integrates the input data IN1 in response to the 270-degree clock signal P270. The fourth sensor 634 selectively receives one of an integrated signal IN2 (output by the fourth integrator 624) and the input data signal IN1 (output by the data buffer 610) in response to the predetermined selection signals SEL1 and SEL2 (FIG. 8) and the 0-degree clock signal P0 and senses, amplifies and latches a selected signal.

The 0-degree clock signal P0 and the 180-degree clock signal P180 are output from the first strobe signal buffer circuit 410. The 0-degree clock signal P0 corresponds to the first reception strobe signal DQS0_1 and the 180-degree clock signal P180 corresponds to an inverted signal of the first reception strobe signal DQS0_1, i.e., a signal having a phase difference of 180 degrees with the first reception strobe signal DQS0_1. The 90-degree clock signal P90 and the 270-degree clock signal P270 are output from the fourth strobe signal buffer circuit 440. The 90-degree clock signal P90 corresponds to the second additional strobe signal DQS1_2 and the 270-degree clock signal P270 corresponds to an inverted signal of the second additional strobe signal DQS1_2.

Referring to FIG. 8, each of the sensors 63j (j=1, 2, 3, 4) includes a multiplexer 810, a sense amplifier 820, and a latch 830 and is a flip-flip circuit having a multiplexing function.

The multiplexer 810 includes first through sixth N-type field effect transistors, e.g., N-FET transistors (e.g., negative-channel metal-oxide semiconductor (NMOS) transistors) NT1, NT2, NT3, NT4, NT5, and NT6; and first and second AND-gates AND1 and AND2. The first NMOS transistor NT1 receives a first input signal IN1 through its gate and the second NMOS transistor NT2 receives an inverted signal IN1B of the first input signal IN1 through its gate. The third NMOS transistor receives a second input signal IN2 through its gate and the fourth NMOS transistor receives an inverted signal IN2B of the second input signal IN2 through its gate. The first AND-gate AND1 performs an AND operation of a first selection signal SEL1 and a clock signal PCLK. The second AND-gate AND2 performs an AND operation of a second selection signal SEL2 and the clock signal PCLK. The fifth NMOS transistor NT5 is turned ON or OFF in response to an output signal of the first AND-gate AND1 and the sixth NMOS transistor NT6 is turned ON or OFF in response to an output signal of the second AND-gate AND2.

The first and second selection signals SEL1 and SEL2 indicate whether to receive the first input signal IN1 or the second input signal IN2 and may be set using mode register set (MRS) or by programming a fuse, etc. When the first input signal IN1 is received, the first selection signal SEL1 is activated to a predetermined logic level (here, a high level). When the second input signal IN2 is received, the second selection signal SEL2 is activated to the high level. When the first input signal IN1 (an output signal of the data buffer 610) is received, the signal IN1 (output by the data buffer 610) is not integrated but sampled to detect data, which is referred to as a sampling scheme. When the second input signal IN2 (an output signal of a corresponding integrator 621, 622, 623, or 624) is received, the signal IN2 (the signal IN2 is generated by integrating the input signal IN1 output by the data buffer 610) which has been integrated to detect data, which is referred to as an integration scheme.

The first input signal IN1 is an output signal of each data buffer 610 (FIG. 6) and the second input signal IN2 is an output signal of the corresponding one of the integrators 621, 622, 623, or 624. With respect to the first sensor 631, the second input signal IN2 is an output signal of the first integrator 621. The clock signal PCLK is a corresponding one among the clock signals P90, P180, P270 and P0. With respect to the first sensor 631, the clock signal PCLK is the 90-degree clock signal P90.

When the first selection signal SEL1 is activated, the fifth NMOS transistor NT5 is turned ON and paths for receiving the first input signal IN1 (i.e., a path from a first node N1 to a ground via the first NMOS transistor NT1 and the fifth NMOS transistor NT5 and a path from a second node N2 to the ground via the second NMOS transistor NT2 and the fifth NMOS transistor NT5) are formed so that the sense amplifier 820 senses and amplifies the first input signal IN1. In contrast, when the second selection signal SEL2 is activated, the sixth NMOS transistor NT6 is turned ON and paths for receiving the second input signal IN2 (i.e., a path from the first node N1 to the ground via the third NMOS transistor NT3 and the sixth NMOS transistor NT6 and a path from the second node N2 to the ground via the fourth NMOS transistor NT4 and the sixth NMOS transistor NT6) are formed so that the sense amplifier 820 senses and amplifies the second input signal IN2.

The sense amplifier 820 includes first through fourth positive-channel MOS (PMOS) transistors PT1, PT2, PT3, and PT4; seventh through eleventh NMOS transistors NT7, NT8, NT9, NT10, and NT11; and a third AND gate AND3.

When the clock signal PCLK is at a logic low level, the first and fourth PMOS transistors PT1, and PT4 are turned ON and third and fourth nodes N3 and N4 are precharged to a high level (of about VDD). When the clock signal PCLK transits to a logic high level, the first and fourth PMOS transistors PT1 and PT4 are turned OFF while the seventh and eighth NMOS transistors NT7 and NT8 whose gates are connected to the fourth node N4 and the ninth and tenth NMOS transistors NT9 and NT10 whose gates are connected to the third node N3 are turned ON.

Hereinafter, it is assumed that the first selection signal SEL1 is activated to the high level and the first input signal IN1 is received. In this case, there occurs a difference between the amount of current flowing in the first NMOS transistor NT1 and the amount of current flowing in the second NMOS transistor NT2 according to the first input signal IN1. Due to this current difference, the amount of current flowing in the seventh NMOS transistor NT7 becomes different from the amount of current flowing in the tenth NMOS transistor NT10. As a result, a voltage of the third node N3 becomes different from a voltage of the fourth node N4. When the first input signal IN1 is at the high level, the amount of current flowing through the seventh and first NMOS transistors NT7 and NT1 is greater than the amount of current flowing through the tenth and second NMOS transistors NT10 and NT2. As a result, the voltage of the third node N3 gradually decreases while the voltage of the fourth node N4 gradually increases. In contrast, when the first input signal IN1 is at the low level, the voltage of the fourth node N4 gradually decreases while the voltage of the third node N3 gradually increases.

When the second selection signal SEL2 is at the high level and the second input signal IN2 is received, a difference between the voltage of the third node N3 and the voltage of the fourth node N4 occurs according to the second input signal IN2.

The latch 830 latches an output voltage of the third node N3 and an output voltage of the fourth node N4 and outputs an output signal OUT.

As described above, when the sensor 63j is used, the data receiver 620 can use both of the sampling scheme and the integration scheme. When the integration scheme is used, the transmitter 300 can align the data DQ<i> to edges of the first and second clock signals CLK1 and CLK2 when transmitting the data DQ<i>. When the sampling scheme is used, the transmitter 300 can align the data DQ<i> to centers of the first and second clock signals CLK1 and CLK2 when transmitting the data DQ<i>. In particular, the sampling scheme may be used for the phase correction of the strobe signals DQS0_1, DQS1_2, DQS0_2, and DQS1_1 and of the data DQ<i>.

Generally, since a memory controller and a memory device transmits and receives data, it is preferable that both of the function of the transmitter 300 and the function of the receiver 400 are implemented in a single semiconductor device. However, it is not obligatory to implement both of the transmitter and receiver functions in a single semiconductor device.

In the above-described embodiments of the present invention, two groups of data are transmitted. However, the number of data groups may be increased and the number of transmitted strobe signals may also be increased accordingly. It is preferable to transmit a pair of strobe signals (having a phase difference of 90 degrees) per 2-bytes (16-bits) of data width.

As described above, the present invention does not require a PLL or DLL in a receiver, thereby decreasing circuit area and power consumption as compared to conventional QDR interface systems. In addition, since source synchronization is realized using a strobe signal, phase noise can be efficiently removed. Moreover, instead of a strobe signal used in a conventional DDR memory system, two strobe signals are used, and therefore, the present invention easily provides compatibility with existing DDR memory.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A high-speed interface semiconductor device comprising:
   a clock signal generation circuit configured to generate a first clock signal and a second clock signal that have a phase difference of 90 degrees there-between;
   a first group data transmission circuit configured to multiplex and transmit first group data in response to the first and second clock signals;
   a second group data transmission circuit configured to multiplex and transmit second group data in response to the first and second clock signals;
   a first strobe signal transmission circuit configured to transmit a first strobe signal based on the first clock signal; and
   a second strobe signal transmission circuit configured to transmit a second strobe signal based on the second clock signal,
   wherein at least one of the first strobe signal transmission circuit is configured to adjust phase of the first strobe signal based on first phase-error information fed back from a receiver and then to transmit the phase-adjusted first strobe signal to the receiver.

2. The high-speed interface semiconductor device of claim 1, wherein the first strobe signal transmission circuit comprises:
   a first phase adjuster configured to adjust the phase of the first clock signal; and
   a first signal transmitter configured to transmit an output signal of the first phase adjuster via a signal line, and
   wherein the second strobe signal transmission circuit comprises:
   a second phase adjuster configured to adjust the phase of the second clock signal; and
   a second signal transmitter configured to transmit an output signal of the second phase adjuster via a signal line.

3. The high-speed interface semiconductor device of claim 2, wherein the first phase adjuster is configured to adjust the phase of the first strobe signal so that the phase of the first strobe signal coincides with the phase of one data among the first group data in the receiver, and the second phase adjuster is configured to adjust the phase of the second strobe signal so that the phase of the second strobe signal coincides with the phase of one data among the second group data in the receiver.

4. The high-speed interface semiconductor device of claim 3, wherein each of the first and second data transmission circuits comprises:
   a data phase adjuster configured to adjust the phase of the first clock signal and the phase of the second clock signal;
   a multiplexer configured to multiplex an input signal using output signals of the data phase adjuster; and
   a data transmitter configured to transmit an output signal of the multiplexer.

5. The high-speed interface semiconductor device of claim 1, wherein the high-speed interface semiconductor device is a memory controller.

6. A high-speed interface semiconductor device comprising:
- a strobe signal reception circuit configured to receive a first strobe signal and a second strobe signal, which have a phase difference of 90 degrees there-between, and to generate first group strobe signals and second group strobe signals;
- a first group data reception circuit configured to receive first group data synchronized with the first group strobe signals; and
- a second group data reception circuit configured to receive second group data synchronized with the second group strobe signals,
- wherein the strobe signal reception circuit is further configured to feed back phase-error information for adjusting the phase of the first strobe signal, and to receive the phase-adjusted first group strobe signal.

7. The high-speed interface semiconductor device of claim 6, wherein the strobe signal reception circuit comprises:
- a first strobe signal buffer configured to receive the first strobe signal and outputting a first reception strobe signal corresponding to one among the first group strobe signals;
- a second strobe signal buffer configured to adjust the phase of the first strobe signal and to output a first additional strobe signal corresponding to one among the second group strobe signals;
- a third strobe signal buffer configured to receive the second strobe signal and to output a second reception strobe signal corresponding to another one among the second group strobe signals; and
- a fourth strobe signal buffer configured to adjust the phase of the second strobe signal and to output a second additional strobe signal corresponding to another one among the first group strobe signals,
- wherein the first group data reception circuit is configured to receive the first group data in response to the first reception strobe signal and the second additional strobe signal, and
- the second group data reception circuit is configured to receive the second group data in response to the second reception strobe signal and the first additional strobe signal.

8. The high-speed interface semiconductor device of claim 7, wherein the second strobe signal buffer is configured to adjust the phase of the first additional strobe signal to coincide with the phase of one data included in the second group data, and the fourth strobe signal buffer is configured to adjust the phase of the second additional strobe signal to coincide with the phase of one data included in the first group data.

9. The high-speed interface semiconductor device of claim 6, wherein each of the first and second data reception circuits comprises:
- a buffer configured to buffer corresponding data included in the first group data or the second group data; and
- a data receiver configured to receive an output signal of the buffer and to output demultiplexed output data, and the data receiver comprises:
- first through fourth integrators configured to integrate the output signal of the buffer in response to the first reception strobe signal, the second additional strobe signal, an inverted signal of the first reception strobe signal, and an inverted signal of the second additional strobe signal, respectively; and
- first through fourth sensors each configured to selectively receive, sense and amplify a selected one of the output signal of the buffer and an integrated signal output by a corresponding integrator among the first through fourth integrators, selected in response to a corresponding signal among: the second additional strobe signal; the inverted signal of the first reception strobe signal; the inverted signal of the second additional strobe signal; and the first reception strobe signal.

10. The high-speed interface semiconductor device of claim 9, wherein each of the first through fourth sensors comprises:
- a multiplexer configured to selectively form one path among a path for receiving the output signal of the buffer and a path for receiving the integrated signal output by the corresponding integrator among the first through fourth integrators, according to a predetermined selection signal and further configured to receive one signal among the output signal of the buffer and the integrated signal by the corresponding integrator;
- a sense amplifier configured to sense and amplify the signal received by the multiplexer; and
- a latch configured to latch an output signal of the sense amplifier.

11. A high-speed interface method for a semiconductor device, comprising:
- generating a first clock signal and a second clock signal that have a phase difference of 90 degrees there-between;
- transmitting first group data in response to the first and second clock signals;
- transmitting second group data in response to the first and second clock signals;
- transmitting a first strobe signal based on the first clock signal; and
- transmitting a second strobe signal based on the second clock signal,
- wherein phase of at least one of the first and second strobe signals is adjusted based on phase-error information fed back from a receiver and then the phase-adjusted strobe signal is transmitted to the receiver.

12. The high-speed interface method of claim 11, wherein the transmitting of the first strobe signal comprises adjusting the phase of the first strobe signal so that the phase of the first strobe signal coincides with the phase of one data included in the first group data in the receiver.

13. The high-speed interface method of claim 11, wherein the transmitting of the second strobe signal comprises adjusting the phase of the second strobe signal so that the phase of the second strobe signal coincides with the phase of one data included in the second group data in the receiver.

14. A high-speed interface method for a semiconductor device, comprising:
- receiving a first strobe signal and a second strobe signal, that have a phase difference of 90 degrees there-between, from a transmitter;
- feeding back first phase-error information from a receiver and adjusting the phase of the first strobe signal based on the first phase-error information and generating two phase-adjusted first group strobe signals based on the phase-adjusted first strobe signal;
- feeding back second phase-error information from the receiver and adjusting the phase of the second strobe signal based on the second phase-error information and generating two phase-adjusted second group strobe signals based on the phase-adjusted second strobe signal; and receiving first group data synchronized with the two first group strobe signals and second group data synchronized with the two second group strobe signals.

15. The high-speed interface method of claim 14, wherein the receiving the first and second strobe signals comprises:
   receiving the first strobe signal and outputting a first reception strobe signal corresponding to one among the two first group strobe signals using a first strobe signal buffer;
   adjusting the phase of the first strobe signal and outputting a first additional strobe signal corresponding to one among the two second group strobe signals using a second strobe signal buffer;
   receiving the second strobe signal and outputting a second reception strobe signal corresponding to another one among the two second group strobe signals using a third strobe signal buffer; and
   adjusting the phase of the second strobe signal and outputting a second additional strobe signal corresponding to another one among the two first group strobe signals using a fourth strobe signal buffer.

16. The high-speed interface method of claim 15, wherein the receiving the first group data and the second group data comprises:
   receiving the first group data in synchronization with the first reception strobe signal and the second additional strobe signal; and
   receiving the second group data in synchronization with the second reception strobe signal and the first additional strobe signal.

17. The high-speed interface method of claim 16, wherein the adjusting the phase of the first strobe signal and outputting the first additional strobe signal comprises adjusting the phase of the first additional strobe signal to coincide with the phase of one data among the second group data, and
   wherein the adjusting the phase of the second strobe signal and outputting the second additional strobe signal comprises adjusting the phase of the second additional strobe signal to coincide with the phase of one data among the first group data.

18. A high-speed interface semiconductor system comprising:
   a transmitter configured to transmit:
      a first strobe signal and a second strobe signal that have a phase difference of 90 degrees there-between;
      first group data; and
      second group data; and
   a receiver configured to receive the first and second strobe signals from the transmitter and to receive the first group data and the second group data using the first and second strobe signals,
   wherein the transmitter is configured to adjust the phase of the first and strobe signal based on phase-error information fed back from the receiver and then to transmit the phase-adjusted first strobe signal to the receiver.

19. The high-speed interface semiconductor system of claim 18, wherein the receiver comprises:
   a first strobe signal buffer configured to receive the first strobe signal and to output a first reception strobe signal;
   a second strobe signal buffer configured to adjust the phase of the first strobe signal and to output a first additional strobe signal;
   a third strobe signal buffer configured to receive the second strobe signal and to output a second reception strobe signal;
   a fourth strobe signal buffer configured to adjust the phase of the second strobe signal and to output a second additional strobe signal;
   a first group data reception circuit configured to receive the first group data in response to the first reception strobe signal and the second additional strobe signal; and
   a second group data reception circuit configured to receive the second group data in response to the second reception strobe signal and the first additional strobe signal.

20. The high-speed interface semiconductor system of claim 19, wherein the transmitter is configured to adjust the phase of the first strobe signal so that the phase of the first reception strobe signal coincides with the phase of one data among the first group data and to adjust the phase of the second strobe signal so that the phase of the second reception strobe signal coincides with the phase of one data among the second group data.

21. The high-speed interface semiconductor system of claim 20, wherein the receiver is configured to adjust the phase of the first additional strobe signal to coincide with the phase of one data among the second group data and to adjust the phase of the second additional strobe signal to coincide with the phase of one data among the first group data.

22. The high-speed interface semiconductor system of claim 21, wherein the transmitter is configured to adjust the phase of each data among the first group data based on the phase of the first reception strobe signal and the phase of the second additional strobe signal and to adjust the phase of each data among the second group data based on the phase of the second reception strobe signal and the phase of the first additional strobe signal.

23. A high-speed interface method for a semiconductor device, comprising:
   generating a first clock signal and a second clock signal;
   transmitting from the transmitter to a receiver one data among first group data and a first strobe signal based on the first clock signal;
   receiving at the receiver the one data in synchronization with the first strobe signal and feeding first phase-error information back to the transmitter;
   adjusting at the transmitter phase of the first strobe signal based on the first phase-error information;
   transmitting from the transmitter to the receiver one data among second group data and a second strobe signal based on the second clock signal;
   receiving at the receiver the one data in synchronization with the second strobe signal and feeding second phase-error information back to the transmitter; and
   adjusting at transmitter the phase of the second strobe signal based on the second phase-error information.

24. The high-speed interface method of claim 23, further comprising:
   transmitting from the transmitter to the receiver one data among the second group data and the first strobe signal;
   receiving at the receiver the first strobe signal and adjusting the phase of the received signal to generate a first additional strobe signal;
   transmitting from the transmitter to the receiver one data among the first group data and the second strobe signal; and
   receiving at the receiver the second strobe signal and adjusting the phase of the received signal to generate a second additional strobe signal.

25. The high-speed interface method of claim 24, further comprising:

adjusting the phase of each of the first group data other than the one data based on the phase-adjusted first strobe signal and the second additional strobe signal; and adjusting the phase of each of the second group data other than the one data based on the phase-adjusted second strobe signal and the first additional strobe signal.

* * * * *